US011739425B2

(12) United States Patent
Tryon et al.

(10) Patent No.: US 11,739,425 B2
(45) Date of Patent: Aug. 29, 2023

(54) ELECTRONIC DEVICE COATINGS FOR REFLECTING MID-SPECTRUM VISIBLE LIGHT

(71) Applicant: Apple Inc., Cupertino, CA (US)

(72) Inventors: Brian S. Tryon, Redwood City, CA (US); Lijie Bao, Saratoga, CA (US); Martin Melcher, Mountain View, CA (US); Sonja R. Postak, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 349 days.

(21) Appl. No.: 16/932,621

(22) Filed: Jul. 17, 2020

(65) Prior Publication Data

US 2021/0048565 A1 Feb. 18, 2021

Related U.S. Application Data

(60) Provisional application No. 62/897,595, filed on Sep. 9, 2019, provisional application No. 62/886,837, filed on Aug. 14, 2019.

(51) Int. Cl.
*G02B 5/28* (2006.01)
*H05K 5/02* (2006.01)
(Continued)

(52) U.S. Cl.
CPC .............. *C23C 28/34* (2013.01); *C23C 28/32* (2013.01); *G02B 5/285* (2013.01); *H05K 5/02* (2013.01);
(Continued)

(58) Field of Classification Search
CPC ........................ Y10T 428/12583; G02B 5/285
See application file for complete search history.

(56) References Cited

U.S. PATENT DOCUMENTS 6,451,414 B1 9/2002 Wheatley et al.
6,775,460 B2 8/2004 Steiner et al.
(Continued)

FOREIGN PATENT DOCUMENTS

CN 1957114 A 5/2007
CN 100999383 A 7/2007
(Continued)

OTHER PUBLICATIONS

Chen Keming, Architectural Glass Processing Technology—Glass Coating Technology, Dec. 31, 2010, p. 93-96.

*Primary Examiner* — Adam Krupicka
(74) *Attorney, Agent, or Firm* — TREYZ LAW GROUP, P.C.; Michael H. Lyons

(57) ABSTRACT

An electronic device may include conductive structures having a visible-light-reflecting coating. The coating may include a seed layer, transition layers, a neutral-color base layer, and an uppermost layer that forms a single-layer interference film. The neutral-color base layer may be opaque to visible light. The interference film may include silicon and may have an absorption coefficient between 0 and 1. The interference film may include, for example, CrSiN or CrSiCN. The composition of the interference film, the thickness of the interference film, and/or the composition of the base layer may be selected to provide the coating with a desired color near the middle of the visible spectrum (e.g., at green wavelengths). The color may be relatively stable even if the thickness of the coating varies across its area.

24 Claims, 10 Drawing Sheets

(51) Int. Cl.
*C23C 28/00* (2006.01)
*H05K 5/04* (2006.01)

(52) U.S. Cl.
CPC ......... *H05K 5/04* (2013.01); *Y10T 428/12583* (2015.01)

(56) References Cited

U.S. PATENT DOCUMENTS

| | | | |
|---|---|---|---|
| 6,898,012 | B2 | 5/2005 | Kaminsky et al. |
| 7,232,594 | B2 | 6/2007 | Miroshin et al. |
| 7,494,231 | B2 | 2/2009 | Varaprasad et al. |
| 7,614,750 | B2 | 11/2009 | May et al. |
| 8,676,005 | B2 | 3/2014 | Yagi et al. |
| 8,697,249 | B1 | 4/2014 | Zhang |
| 9,365,450 | B2 | 6/2016 | Ding et al. |
| 9,651,847 | B2 | 5/2017 | O'Keeffe |
| 2002/0109842 | A1 | 8/2002 | Carroll, Jr. et al. |
| 2007/0230191 | A1 | 10/2007 | Komuro et al. |
| 2014/0044944 | A1* | 2/2014 | Cha ..................... C23C 14/0641 428/697 |
| 2017/0123122 | A1 | 5/2017 | Ballif et al. |
| 2018/0081086 | A1 | 3/2018 | Wang et al. |
| 2019/0079230 | A1 | 3/2019 | Nguyen et al. |
| 2019/0353836 | A1 | 11/2019 | Wilson et al. |
| 2020/0071838 | A1 | 3/2020 | Tryon et al. |
| 2020/0096686 | A1 | 3/2020 | Cool et al. |

FOREIGN PATENT DOCUMENTS

| | | | |
|---|---|---|---|
| CN | 102656292 | A | 9/2012 |
| CN | 103567374 | A | 2/2014 |
| CN | 104582333 | A | 4/2015 |
| CN | 108873112 | A | 11/2018 |
| CN | 208362448 | U | 1/2019 |
| EP | 3640362 | A2 | 4/2020 |
| JP | 2007254851 | A | 10/2007 |
| WO | 2008007165 | A1 | 1/2008 |

* cited by examiner

ELECTRONIC DEVICE COATINGS FOR REFLECTING MID-SPECTRUM VISIBLE LIGHT

This application claims the benefit of provisional application No. 62/886,837, filed Aug. 14, 2019, and provisional application No. 62/897,595, filed Sep. 9, 2019, each of which is incorporated by reference herein in its entirety.

FIELD

This relates generally to coatings for electronic device structures and, more particularly, to visible-light-reflecting coatings for conductive electronic device structures.

BACKGROUND

Electronic devices such as cellular telephones, computers, watches, and other devices contain conductive structures such as conductive housing structures. The conductive structures are provided with a coating that reflects particular wavelengths of light so that the conductive components exhibit a desired visible color.

It can be difficult to provide coatings with a relatively uniform thickness, particularly on conductive structures with non-planar shapes. If care is not taken, thickness variations in the coating can undesirably distort the color and visual appearance of the coating across its area.

SUMMARY

An electronic device may include conductive structures such as conductive housing structures. The conductive structures may have three-dimensional surfaces or other non-planar shapes. A visible-light-reflecting coating may be formed on the conductive structures. The coating may include a seed layer on the conductive structures, one or more transition layers on the seed layer, a neutral-color base layer on the transition layers, and a single-layer interference film on the neutral-color base layer. The single-layer interference film may be the uppermost layer of the coating. The neutral-color base layer may be opaque to visible light.

The single-layer interference film may include silicon and may have an absorption coefficient between 0 and 1. The single-layer interference film may include, for example, CrSiN, CrSiCN, AlTiSiN, or TiSiN. The neutral-color base layer may include, for example, CrSiCN. The composition of the single-layer interference film, the thickness of the single-layer interference film, and/or the composition of the neutral-color base layer may be selected to provide the coating with a desired color near the middle of the visible spectrum (e.g., a green color). Light reflected by the interfaces of the single-layer interference film may constructively and destructively interfere to exhibit a relatively uniform reflected intensity across a wavelength band near the middle of the visible spectrum (e.g., at green wavelengths). This may configure the coating to exhibit a relatively uniform (stable) color near the middle of the visible spectrum even if the thickness of the coating varies across its area.

DETAILED DESCRIPTION

Electronic devices and other items may be provided with conductive structures. Coatings may be formed on the conductive structures to reflect particular wavelengths of visible light so that the conductive structures exhibit a desired color. A visible-light-reflecting coating may be deposited on a conductive substrate. The visible-light reflecting coating may include transition and adhesion layers on the substrate, a neutral-color base layer on the transition and adhesion layers, and an upper-most single-layer interference film on the neutral-color base layer. In other suitable arrangements, the coating may include a non-neutral (colored) base layer instead of a neutral-color base layer and/or a multi-layer thin-film interference filter on the base layer instead of a single-layer interference film.

The single-layer interference film may have a thickness and a composition that configures the coating to reflect light of a particular color near the middle of the visible spectrum (e.g., a green color). The single-layer interference film may include chromium silicon nitride, chromium silicon carbonitride, or aluminum titanium silicon nitride, for example. The composition of the single-layer interference film may be selected to provide the coating with a non-zero absorption coefficient at some wavelengths to help tune the reflected color of the coating.

The single-layer interference film and the neutral-color base layer may be relatively color-insensitive to variations in thickness of the coating. For example, even if the coating exhibits different thicknesses across its area (e.g., due to limitations in the deposition equipment used to deposit the coating and/or in scenarios where the substrate has a three-dimensional shape), the reflected intensity of the coating may be relatively uniform (e.g., without significant local minima or maxima) across the wavelength band that gives the color of the coating. This may allow the coating and thus the underlying substrate to exhibit a uniform color and aesthetic appearance, even if the substrate is three dimensional and even if the deposition equipment used to deposit the coating is incapable of providing the coating with a precise thickness across its area.

Figure 1:
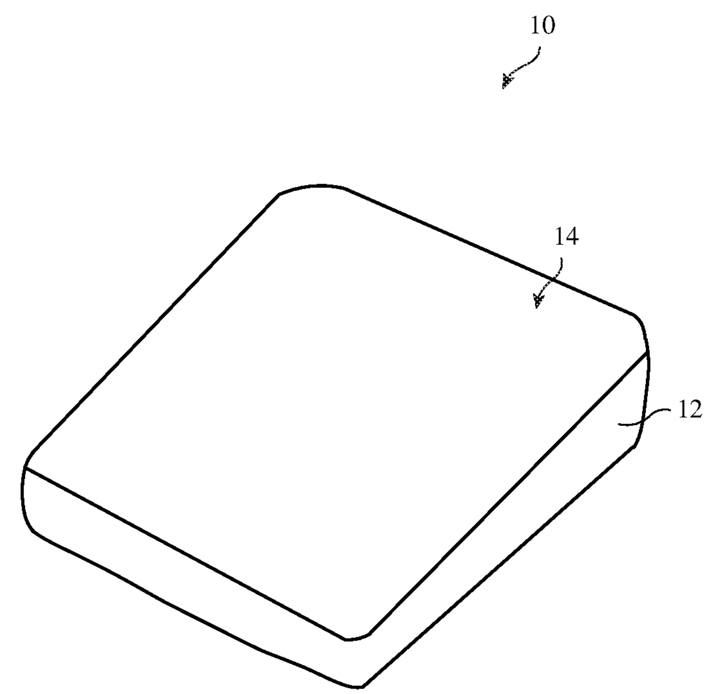
FIG. 1 is a perspective view of an illustrative electronic device of the type that may be provided with conductive structures and visible-light-reflecting coatings in accordance with some embodiments.
Figure 1:
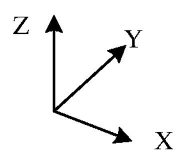

An illustrative electronic device of the type that may be provided with conductive structures and visible-light-reflecting coatings is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head (e.g., a head mounted device), or other wearable or miniature device, a television, a computer display that does not contain an embedded computer, a gaming device, a navigation device, an embedded system such as a system in which electronic equipment with a display is mounted in a kiosk or automobile, a wireless base station, a home entertainment system, a wireless speaker device, a wireless access point, equipment that implements the functionality of two or more of these devices, or other electronic equipment. In the illustrative configuration of FIG. 1, device 10 is a portable device having a substantially rectangular lateral outline such as a cellular telephone or tablet computer. Other configurations may be used for device 10 if desired. The example of FIG. 1 is merely illustrative.

In the example of FIG. 1, device 10 includes a display such as display 14. Display 14 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have metal sidewalls or sidewalls formed from other materials. Examples of metal materials that may be used for forming housing 12 include stainless steel, aluminum, silver, gold, titanium, metal alloys, or any other desired conductive material.

Display 14 may be formed at (e.g., mounted on) the front side (face) of device 10. Housing 12 may have a rear housing wall on the rear side (face) of device 10 that opposes the front face of device 10. Conductive housing sidewalls in housing 12 may surround the periphery of device 10. The rear housing wall of housing 12 may be formed from conductive materials and/or dielectric materials.

The rear housing wall of housing 12 and/or display 14 may extend across some or all of the length (e.g., parallel to the X-axis of FIG. 1) and width (e.g., parallel to the Y-axis) of device 10. Conductive sidewalls of housing 12 may extend across some or all of the height of device 10 (e.g., parallel to Z-axis).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode (OLED) display pixels, an array of electrowetting display pixels, or display pixels based on other display technologies.

Display 14 may be protected using a display cover layer. The display cover layer may be formed from a transparent material such as glass, plastic, sapphire or other crystalline dielectric materials, ceramic, or other clear materials. The display cover layer may extend across substantially all of the length and width of device 10, for example.

Device 10 may include one or more buttons. The buttons may be formed from a conductive button member that is located within (e.g., protruding through) openings in housing 12 or openings in display 14 (as examples). Buttons may be rotary buttons, sliding buttons, buttons that are actuated by pressing on a movable button member, etc.

Figure 2:
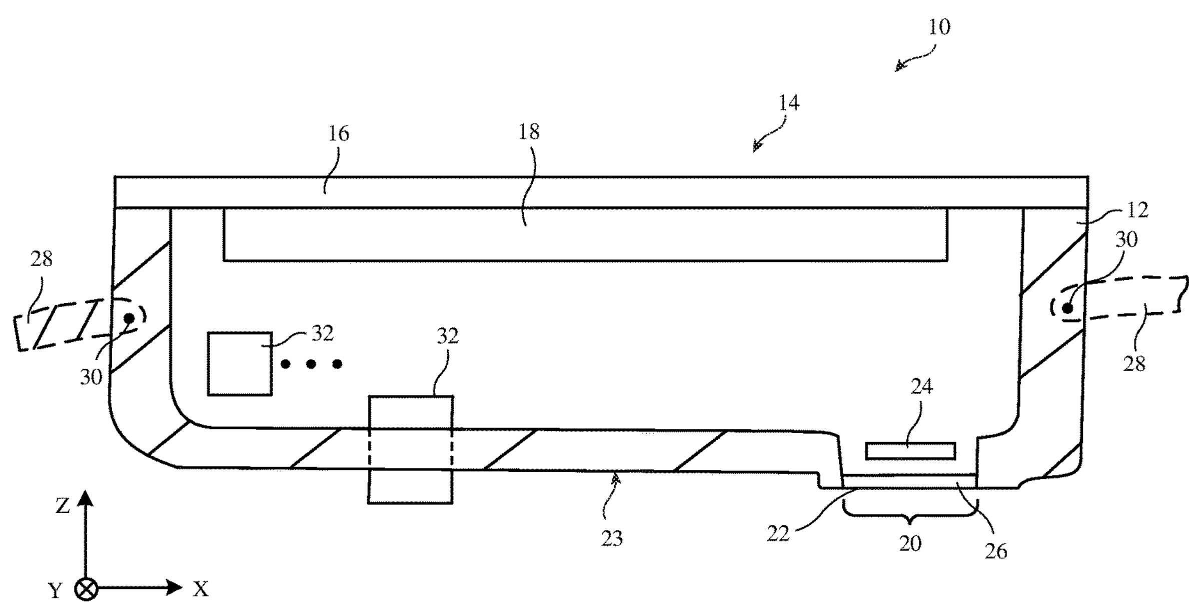
FIG. 2 is cross-sectional side view of an illustrative electronic device having conductive structures that may be provided with visible-light-reflecting coatings in accordance with some embodiments.

A cross-sectional side view of device 10 in an illustrative configuration in which display 14 has a display cover layer is shown in FIG. 2. As shown in FIG. 2, display 14 may have one or more display layers that form pixel array 18. During operation, pixel array 18 forms images for a user in an active area of display 14. Display 14 may also have inactive areas (e.g., areas along the border of pixel array 18) that are free of pixels and that do not produce images. Display cover layer 16 of FIG. 2 overlaps pixel array 18 in the active area and overlaps electrical components in device 10.

Display cover layer 16 may be formed from a transparent material such as glass, plastic, ceramic, or crystalline materials such as sapphire. Illustrative configurations in which a display cover layer and other transparent members in device 10 (e.g., windows for cameras and other light-based devices that are formed in openings in housing 12) are formed from a hard transparent crystalline material such as sapphire (sometimes referred to as corundum or crystalline aluminum oxide) may sometimes be described herein as an example. Sapphire makes a satisfactory material for display cover layers and windows due to its hardness (9 Mohs). In general, however, these transparent members may be formed from any suitable material.

Display cover layer 16 for display 14 may planar or curved and may have a rectangular outline, a circular outline, or outlines of other shapes. If desired, openings may be formed in the display cover layer. For example, an opening may be formed in the display cover layer to accommodate a button, a speaker port, or other component. Openings may be formed in housing 12 to form communications or data ports (e.g., an audio jack port, a digital data port, a port for a subscriber identity module (SIM) card, etc.), to form openings for buttons, or to form audio ports (e.g., openings for speakers and/or microphones).

Device 10 may, if desired, be coupled to a strap such as strap 28 (e.g., in scenarios where device 10 is a wristwatch device). Strap 28 may be used to hold device 10 against a user's wrist (as an example). Strap 28 may sometimes be referred to herein as wrist strap 28. In the example of FIG. 2, wrist strap 28 is connected to attachment structures 30 in housing 12 at opposing sides of device 10. Attachment structures 30 may include lugs, pins, springs, clips, brackets, and/or other attachment mechanisms that configure housing 12 to receive wrist strap 28. Configurations that do not include straps may also be used for device 10.

Figure 3:
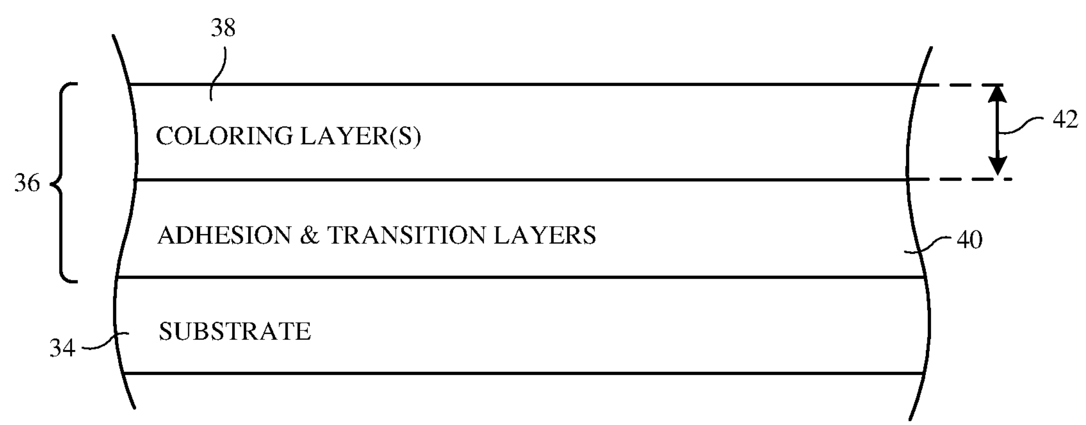
FIG. 3 is a cross-sectional side view of an illustrative visible-light-reflecting coating having a coloring layer that is highly sensitive to thickness variations in accordance with some embodiments.

If desired, light-based components such as light-based components 24 may be mounted in alignment with an opening 20 in housing 12. Opening 20 may be circular, may be rectangular, may have an oval shape, may have a triangular shape, may have other shapes with straight and/or curved edges, or may have other suitable shapes (outlines when viewed from above). Window member 26 may be mounted in window opening 20 of housing 12 so that window member 26 overlaps component 18. A gasket, bezel, adhesive, screws, or other fastening mechanisms may be used in attaching window member 26 to housing 12. Surface 22 of window member 26 may lie flush with exterior surface 23 of housing 12, may be recessed below exterior surface 23, or may, as shown in FIG. 3, be proud of exterior surface 23 (e.g., surface 22 may lie in a plane that protrudes away from surface 23 in the −Z direction). In other words, window member 26 may be mounted to a protruding portion of housing 12. Surface 23 may, for example, form the rear face of housing 12.

Conductive structures in device 10 may be provided with a visible-light-reflecting coating that reflects certain wavelengths of light so that the conductive structures exhibit a desired aesthetic appearance (e.g., a desired color, reflectivity, etc.). The conductive structures in device 10 may include, for example, conductive portions of housing 12 (e.g., conductive sidewalls for device 10, a conductive rear wall for device 10, a protruding portion of housing 12 used to mount window member 26, etc.), attachment structures 30, conductive portions of wrist strap 28, a conductive mesh, conductive components 32, and/or any other desired conductive structures on device 10. Conductive components 32 may include internal components (e.g., internal housing members, a conductive frame, a conductive chassis, a conductive support plate, conductive brackets, conductive clips, conductive springs, input-output components or devices, etc.), components that lie both at the interior and exterior of device 10 (e.g., a conductive SIM card tray or SIM card port, a data port, a microphone port, a speaker port, a conductive button member, etc.), or components that are mounted at the exterior of device 10 (e.g., conductive portions of strap 28 such as a clasp for strap 28), and/or any other desired conductive structures on device 10.

FIG. 3 is a cross-sectional diagram of a visible-light-reflecting coating that may be provided on conductive structures in device 10 (e.g., portions of housing 12 of FIGS. 1 and 2, conductive components 32 of FIG. 2, etc.). As shown in FIG. 3, visible-light-reflecting coating 36 may be formed on substrate 34. Substrate 34 may be a conductive structure in device 10 such as a conductive portion of housing 12 (FIGS. 1 and 2) or a conductive component 32 (FIG. 2). Substrate 34 may be thicker than coating 36. The thickness of substrate 34 may be 0.1 mm to 5 mm, more than 0.3 mm, more than 0.5 mm, between 5 mm and 20 mm, less than 5 mm, less than 2 mm, less than 1.5 mm, or less than 1 mm (as examples). Substrate 34 may include stainless steel, aluminum, titanium, or other metals or alloys.

Coating 36 may include adhesion and transition layers 40 on substrate 34 and one or more uppermost (top) coloring layer(s) 38 on adhesion and transition layers 40. The composition of coloring layer(s) 38 may configure coating 36 to absorb and reflect light at selected wavelengths to impart coating 36 and thus substrate 34 with a desired color and reflectivity.

Coloring layer(s) 38 may, for example, include an intrinsically-colored layer that preferentially absorbs light at particularly wavelengths to reveal the color of the reflected wavelengths to an observer. As an example, coloring layer(s) 38 may include metal nitride, carbide, or carbonitride that provide coating 36 with an intrinsic color. These types of intrinsically-colored layers may exhibit a limited range of possible colors, thereby limiting the aesthetic characteristics of device 10.

In another suitable arrangement, coloring layer(s) 38 may include a thin film interference filter having multiple alternating layers of high and low refractive index materials. Light may reflect off of the interfaces between the layers of the thin film interference filter and the reflected light may constructively and destructively interfere at certain wavelengths to produce reflected light of a particular color and reflectivity for an observer. As an example, the thin film interference filter may include layers of silicon nitride, titanium nitride, zirconium oxide, tantalum oxide, niobium oxide, silicon oxide, aluminum oxide, etc.

In practice, it can be difficult to deposit coloring layer(s) 38 as a thin film interference filter with a relatively uniform thickness 42 across the entire layer. Providing coloring layer(s) 38 with a uniform thickness 42 is particularly difficult when substrate 34 has a three-dimensional geometry instead of a planar geometry (e.g., when the coating is deposited on a three-dimensional conductive structure such as an edge or curved portion of housing 12 of FIGS. 1 and 2, attachment structures 30 of FIG. 2, a three-dimensional conductive component 32 of FIG. 2 such as a conductive button member, a conductive portion of strap 28, an audio port for device 10, a data port for device 10, a SIM card tray for device 10, etc.).

The reflected color exhibited by these types of thin film interference filters may be highly sensitive to thickness variations across the coating. In general, the thickness 42 of coloring layer(s) 38 may determine the reflective characteristics and thus the perceived visible color of coating 36. Small variations in thickness 42 across the lateral area of coloring layer(s) 38 can change the local reflectivity of the coating as a function of wavelength, providing the coating and thus substrate 34 with an unattractive, non-uniform color that varies across its area. Coating 36 may be particularly sensitive to these variations when it is desired to provide coating 36 and substrate 34 with a color near the middle of the visible light spectrum (e.g., with a green color or another color at or around 500-600 nm).

Figure 4:
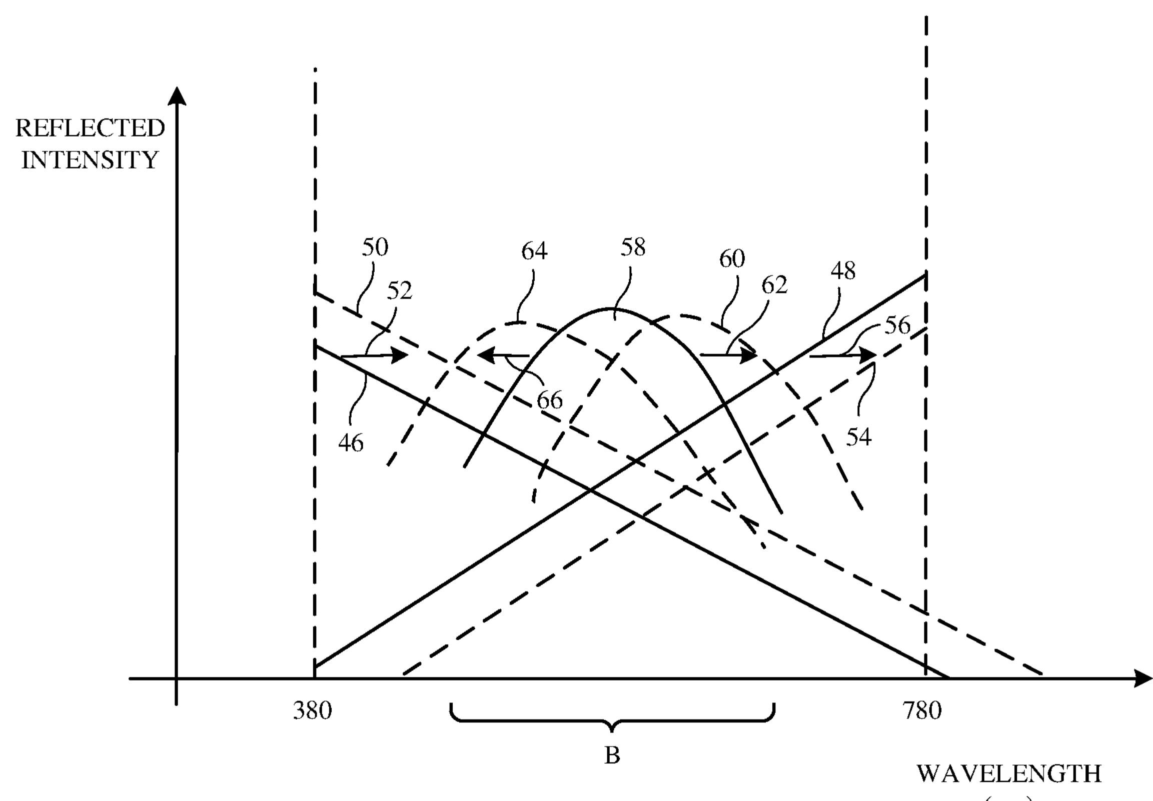
FIG. 4 is a plot of reflected intensity as a function of wavelength for an illustrative visible-light-reflecting coating that is highly sensitive to thickness variations in accordance with some embodiments.

FIG. 4 is a plot of reflected intensity as a function of wavelength for a coating that is highly sensitive to thickness variations such as coating 36 of FIG. 3. In general, the maximum reflected intensity in the visible light spectrum (e.g., between 380 nm and 780 nm) may be most determinative of the color of coating 36 when viewed by an observer.

As shown in FIG. 4, curve 48 illustrates one possible reflective profile for coating 36 in scenarios where coating 36 is configured to exhibit (reflect) a red color. Curve 48 exhibits a maximum value in the visible spectrum at red wavelengths, which thereby imparts the coating with a red color. Increasing the thickness 42 of coating 36 may shift curve 48 to the right, as shown by arrow 56, to provide coating 36 with a reflective response as represented by dashed curve 54. Because dashed curve 54 still exhibits a maximum value at the same wavelengths as curve 48, the increase in thickness 42 associated with arrow 56 may have little effect on the perceived color of the coating (i.e., the coating will still exhibit a red color). Similarly, decreasing thickness 42 will shift curve 48 to the left without changing the maximum value of the curve and thus the color of the coating.

Curve 46 illustrates one possible reflective profile for coating 36 in scenarios where coating 36 is configured to exhibit (reflect) a blue color. Curve 46 exhibits a maximum value in the visible spectrum at blue wavelengths, which thereby imparts the coating with a blue color. Increasing the thickness 42 of coating 36 may shift curve 46 to the right, as shown by arrow 52, to provide coating 36 with a reflective response as represented by dashed curve 50. Because dashed curve 50 still exhibits a maximum value at the same wavelengths as curve 46, the increase in thickness 42 associated with arrow 52 may have little effect on the perceived color of the coating (i.e., the coating will still exhibit a blue color). Similarly, decreasing thickness 42 will shift curve 46 to the left without changing the maximum value of the curve and thus the color of the coating.

In other words, coating 36 may be relatively insensitive to variations in thickness when coating 36 is configured to produce a color near the edge of the visible spectrum (e.g., a red color or a blue color). However, coating 36 may be particularly sensitive to variations in thickness when coating 36 is configured to produce a color near the middle of the visible spectrum such as in band B (e.g., a green color).

Curve 58 illustrates one possible reflective profile for coating 36 in scenarios where coating 36 is configured to exhibit (reflect) a green color. Curve 58 exhibits a maximum value in the visible spectrum at green wavelengths, which thereby imparts the coating with a green color. Increasing the thickness 42 of coating 36 may shift curve 58 to the right, as shown by arrow 62, to provide coating 36 with a reflective response as represented by dashed curve 60. Because dashed curve 60 exhibits a maximum value at higher wavelengths than curve 58, the increase in thickness 42 associated with arrow 62 may have a significant effect on the perceived color of the coating (e.g., pushing the color of the coating more red).

At the same time, decreasing thickness 42 will shift curve 58 to the left, as shown by arrow 66, to provide coating 36 with a reflective response as represented by dashed curve 64. Because dashed curve 64 exhibits a maximum value at lower wavelengths than curve 58, the decrease in thickness 42 associated with arrow 66 may have a significant effect on the perceived color of the coating (e.g., pushing the color of the coating more blue).

Manufacturing limitations associated with the deposition of coating 36 may cause the coating to exhibit different thicknesses across its area, particularly when substrate 34 is a three-dimensional substrate rather than a planar substrate. This may impart coating 36 with the desired color (e.g., the green color associated with curve 58) in some regions of the coating while imparting coating 36 with other undesired colors (e.g., the red-shifted color associated with curve 60 or the blue-shifted color associated with curve 64) in other regions. This may cause substrate 34 and thus device 10 to exhibit an unattractive aesthetic appearance. It may therefore be desirable to be able to provide substrate 34 with a coating that imparts the substrate with a desired color at or near the middle of the visible spectrum (e.g., with a green color), while also exhibiting a reflective response that is relatively insensitive to thickness variations associated with the process for depositing the coating on the substrate.

Figure 5:
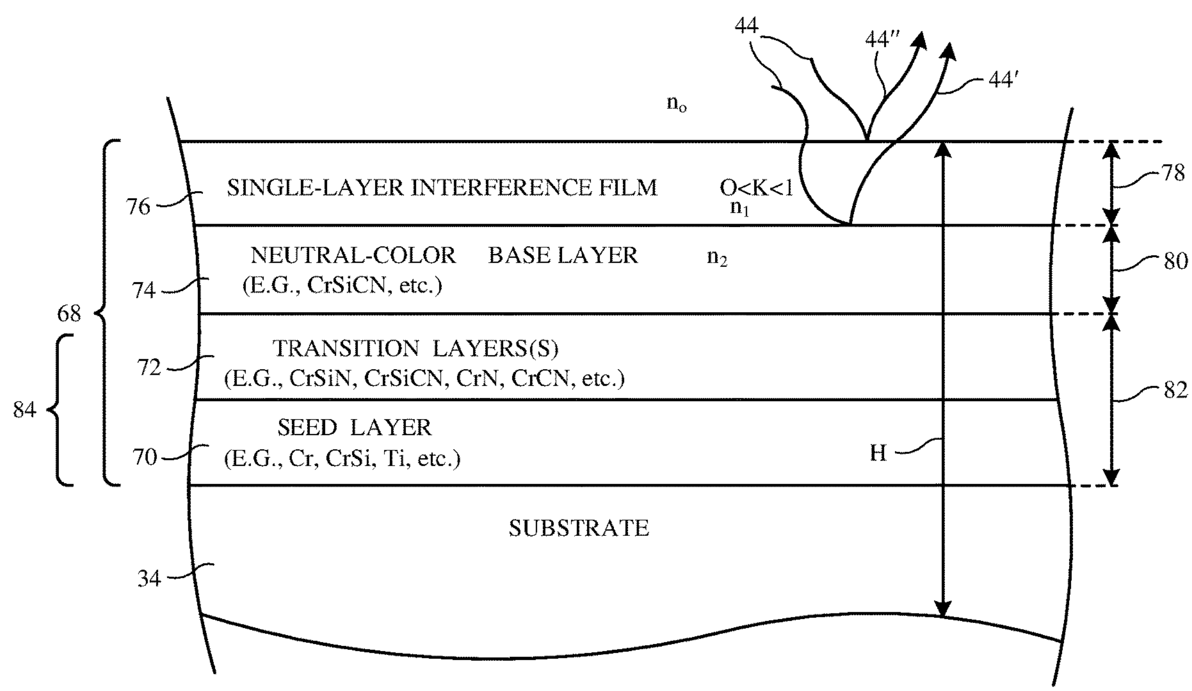
FIG. 5 is a cross-sectional side view of an illustrative coating that reflects visible mid-spectrum light with a relatively uniform reflected intensity in accordance with some embodiments.

FIG. 5 is a cross-sectional side view of an illustrative visible-light-reflecting coating that may impart substrate 34 with mid-spectrum color (e.g., a green color) while also exhibiting a reflective response that is relatively insensitive to thickness variations. As shown in FIG. 5, a coating such as coating 68 may be layered on substrate 34.

The layers of coating 68 may be deposited on substrate 34 using any suitable deposition techniques. Examples of techniques that may be used for depositing the layers in coating 68 include physical vapor deposition (e.g., evaporation and/or sputtering), cathodic arc deposition, chemical vapor deposition, ion plating, laser ablation, etc. For example, coating 68 may be deposited on substrate 34 in a deposition system having deposition equipment (e.g., a cathode). Substrate 34 may be moved (e.g., rotated) within the deposition system while the deposition equipment (e.g., the cathode) deposits the layers of coating 68. If desired, substrate 34 may be moved/rotated dynamically with respect to speed and/or orientation relative to the deposition equipment (e.g., the cathode) during deposition. This may help provide coating 68 with as uniform a thickness as possible across its area, even in scenarios where substrate 34 has a three-dimensional shape.

As shown in FIG. 5, coating 68 may include a seed layer such as seed layer 70 and one or more transition layers such as transition layer(s) 72. Seed layer 70 may couple substrate 34 to the remaining transition layer(s) 72. Seed layer 70 may include chromium (Cr), chromium silicon (CrSi), titanium (Ti), other metals, metal alloys, and/or other materials. Transition layers 72 may include one or more chromium-silicon-nitride (CrSiN) layers, chromium-silicon-carbonitride (CrSiCN) layers, chromium silicon carbide (CrSiC) layers, chromium nitride (CrN) layers, chromium carbonitride (CrCN) layers, and/or any other desired transition layers.

Seed layer 70 and transition layer(s) 72 may sometimes be referred to collectively herein as adhesion and transition layers 84. Adhesion and transition layers 84 may have a thickness 82. Thickness 82 may, for example, be greater than or equal to 0.1 microns, 0.5 microns, 1 micron, 2 microns, 3 microns, or any other desired thickness (e.g., thickness 82 may be between 0.1 and 4 microns, between 0.5 and 3 microns, etc.).

Coating 68 may include a base layer such as neutral-color base layer 74 on adhesion and transition layers 84 (e.g., transition and adhesion layers 74 may couple neutral-color base layer 74 to substrate 34). Neutral-color base layer 74 may exhibit a relatively neutral color (e.g., a relatively uniform reflectivity across the visible spectrum) and may be optically opaque.

For example, neutral-color base layer 74 may exhibit a lightness value (e.g., an L* value in a CIE L*a*b*(CIELAB or Lab) color space) that is between 45 and 65, between 48 and 62, between 50 and 60, between 52 and 58, between 40 and 60, or other neutral lightness values (e.g., where an L* value of 100 corresponds to white and an L* value of 0 corresponds to black). At the same time, neutral-color base layer 74 may exhibit an |a*| value (e.g., in the L*a*b* color space, where a* is a function of the difference between red and green channels and "| |" is the absolute value operator) that is less than approximately 2 (e.g., an a* value that is −1, 0, 1, 1.5, −1.5, 1.9, 0.5, etc.). Similarly, neutral-color base layer 74 may exhibit a |b*| value (e.g., in the L*a*b* color space, where b* is a function of the difference between blue and green channels) that is less than approximately 2 (e.g., an b* value that is −1, 0, 1, 1.5, −1.5, 1.9, 0.5, etc.).

Neutral-color base layer 74 may have thickness 80 and index of refraction $n_2$. As an example, neutral-color base layer 74 may be formed from chromium silicon carbonitride (CrSiCN), carbide, carbonitride, other metal nitrides, or other materials. The relative number of chromium, silicon, carbon, and nitrogen atoms in neutral-color base layer 74 (e.g., in scenarios where layer 74 is formed from CrSiCN) may, for example, be selected to provide neutral-color base layer 74 with the desired neutral color profile and the desired index of refraction $n_2$. Thickness 80 may be, for example, greater than or equal to 0.2 microns, 0.3 microns, 0.4 microns, 0.5 microns, 0.6 microns, 0.7 microns, 0.8 microns, between 0.4 and 0.8 microns, between 0.5 and 0.75 microns, between 0.65 and 0.75 microns, etc.

Coating 68 may include an uppermost (top) layer that is formed from a single-layer interference film such as single-layer interference film 76. Single-layer interference film 76 may include a single layer (film) deposited on neutral-color base layer 74. Single-layer interference film 76 may have a thickness 78 and an index of refraction $n_1$ that is different from the index of refraction $n_2$ of neutral-color base layer 74 and the index of refraction no of air. Index of refraction $n_1$ may, for example, be greater than no and less than $n_2$. If desired, the materials in single-layer interference film 76 may also be configured to absorb some wavelengths of light, such that single-layer interference film 76 has an absorption coefficient k that is less than 1 and greater than 0.

Single-layer interference film 76 may form a thin film interference filter for coating 68. For example, incoming light 44 may reflect off of the exterior surface (interface) of single-layer interference film 76 as reflected light 44". Incoming light 44 may also be refracted and transmitted through single-layer interference film 76. Because neutral-color base layer 74 exhibits an index of refraction $n_2$ that is different from the index of refraction $n_1$ of single-layer interference film 76, light 44 may also be reflected off of the surface (interface) between single-layer interference film 76 and neutral-color base layer 74 as reflected light 44'. Reflected light 44' may be transmitted through single-layer interference film 76 and may constructively and destructively interfere at different wavelengths with reflected light 44".

By controlling the thickness 78 of single-layer interference film 76 as well as the optical characteristics of single-layer interference film 76 (e.g., absorption coefficient k and index of refraction $n_1$), reflected light 44" and 44' may destructively and/or constructively interfere at a selected set of wavelengths such that the combination of reflected light 44" and 44' are perceived by an observer with a desired color. As an example, thickness 78 may be between approximately 50 nm and 150 nm (e.g., between 90 nm and 100 nm, between 80 nm and 110 nm, between 85 nm and 115 nm, etc.) to provide the combination of reflected light 44" and 44' with a desired color near the middle of the visible spectrum (e.g., a green color). Thickness 78 may, for example, be less than thickness 80. Thickness 80 may be less than, equal to, or greater than thickness 82. Coating 68 may have a total thickness H. Total thickness H may be, for example, between 1.2 and 1.8 microns, between 1.3 and 1.7 microns, between 1.4 and 1.6 microns, between 1.1 and 1.9 microns, or other thicknesses.

The composition of single-layer interference film 76 may also be selected to provide single-layer interference film 76 with a desired index of refraction $n_1$ and absorption coefficient k that contribute to the observed color response of coating 68 (e.g., to provide single-layer interference film 76 with a non-zero absorption coefficient at some wavelengths that helps to tune the observed color of the combination of reflected light 44" and 44'). As examples, single-layer interference film 76 may include metal carbonitrides or carbon-oxynitrides or other materials.

Figure 6:
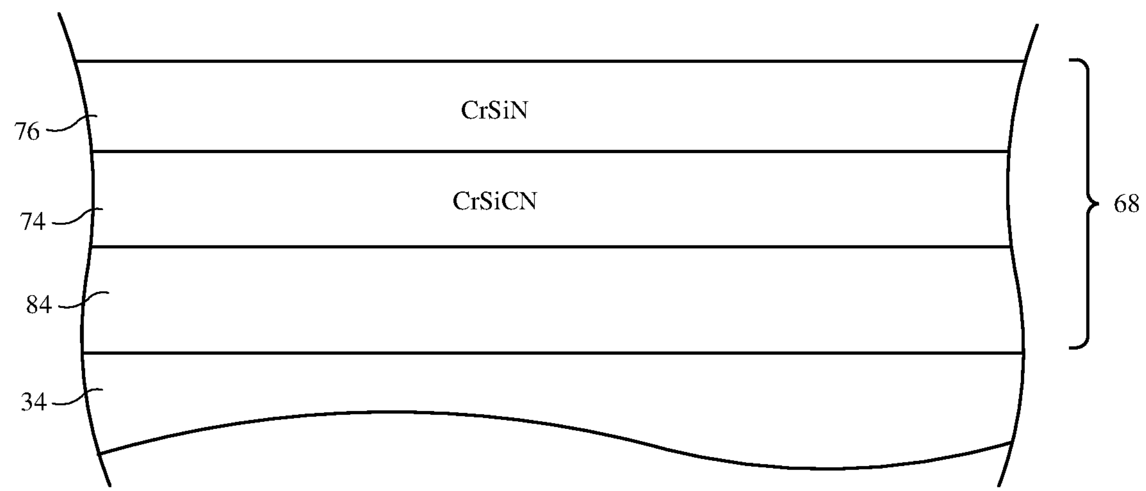
FIG. 6 is a cross-sectional side view of an illustrative coating of the type shown in FIG. 5, having a single-layer interference film formed from chromium silicon nitride in accordance with some embodiments.

Single-layer interference film 76 may, for example, include chromium silicon nitride (CrSiN), as shown in the cross-sectional side view of FIG. 6. As shown in FIG. 6, single-layer interference film 76 may be a CrSiN layer. Neutral-color base layer 74 may be a CrSiCN layer or a layer formed using other suitable materials. Single-layer interference film 76 may, for example, have an atomic percentage of Cr (e.g., the percentage of atoms in film 76 that are chromium atoms) that is less than about 10% and an atomic percentage of Si that is between about 5% and 20% (e.g., between 10% and 18%, between 6% and 15%, etc.). The remaining balance of atoms in film 76 may be N atoms (e.g., film 76 may include more nitrogen atoms than chromium and silicon atoms combined). This is merely illustrative and, in general, film 76 may include any desired percentage of Cr atoms, Si atoms, and N atoms.

Figure 7:
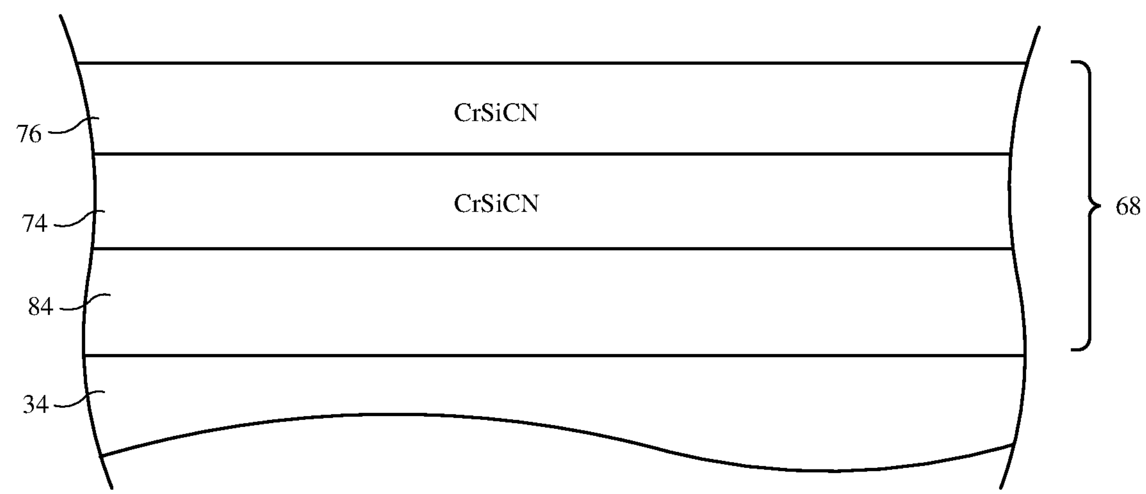
FIG. 7 is a cross-sectional side view of an illustrative coating of the type shown in FIG. 5, having a single-layer interference film formed from chromium silicon carbonitride in accordance with some embodiments.

If desired, single-layer interference film 76 may, for example, include chromium silicon carbonitride (CrSiCN), as shown in the cross-sectional side view of FIG. 7. As shown in FIG. 7, single-layer interference film 76 may be a CrSiCN layer. Neutral-color base layer 74 may be a CrSiCN layer or a layer formed using other suitable materials. Single-layer interference film 76 may, for example, have an atomic percentage of Cr (e.g., the percentage of atoms in film 76 that are chromium atoms) that is less than about 10%, an atomic percentage of Si that is between about 5% and 20% (e.g., between 10% and 18%, between 6% and 15%, etc.), and an atomic percentage of N that is between about 10% and 15% (e.g., between 11% and 14%, between 12% and 15%, etc.). The remaining balance of atoms in film 76 may be C atoms (e.g., film 76 may include more carbon atoms than chromium, silicon, and nitrogen atoms combined).

In another suitable arrangement, single-layer interference film 76 may, for example, have an atomic percentage of Cr that is between 15-30%, between 10-35%, between 10-25%, between 18-28%, less than 25%, less than 30%, less than 35%, or other values, an atomic percentage of Si that is between 60-70%, between 50-80%, between 60-65%, between 55-75%, greater than 50%, greater than 60%, less than 70%, or other values, and an atomic percentage of N that is between 1-10%, 1-5%, 2-12%, 3-9%, less than 10%, less than 15%, or other values. The remaining balance of atoms in film 76 may be C atoms. In this example, neutral-color base layer 74 may have an atomic percentage of Cr that is between 30-40%, between 25-35%, between 27-42%, between 28-38%, less than 35%, less than 40%, less than 45%, or other values, an atomic percentage of Si that is between 40-60%, between 40-50%, between 35-55%, between 42-48%, greater than 40%, greater than 35%, less than 50%, or other values, and an atomic percentage of N that is between 10-25%, 15-24%, 18-22%, less than 25%, less than 30%, or other values. The remaining balance of atoms in layer 74 may be C atoms.

In yet another suitable arrangement, single-layer interference film 76 may, for example, have an atomic percentage of Cr that is between 30-40%, between 30-35%, between 31-35%, between 25-40%, less than 40%, less than 35%, greater than 25%, greater than 30%, or other values, an atomic percentage of Si that is between 20-30%, between 22-28%, between 23-27%, between 15-35%, less than 30%, less than 28%, greater than 20%, greater than 22%, or other values, an atomic percentage of N that is between 30-40%, between 32-38%, between 33-37%, between 25-45%, greater than 25%, greater than 30%, less than 38%, less than 40%, or other values. The remaining balance of atoms in film 76 may be C atoms. In this example, single-layer interference film 76 may configure coating 68 to exhibit an L* value between 40-50, between 45-50, between 47-48, between 40-55, greater than 45, less than 50, or other values, may configure coating 68 to exhibit an a* value between −5 and 0, between −4 and −1, between −10 and 0, less than 0, less than −3, greater than −5, greater than −4, or other values, and may configure coating 68 to exhibit a b* value between −15 and −10, between −12 and −9, between −10 and −11, less than −8, less than −10, greater than −12, greater than −11, or other values (e.g., coating 68 in this example may exhibit a blue color). In this example, the thickness of neutral-color base layer 74 (e.g., thickness 80 of FIG. 5) may be between 0.8 and 1.2 microns, between 0.9 and 1.1 microns, approximately 1 micron, less than 1.3 microns, greater than 0.8 microns, or other values, and the thickness of single-layer interference film 76 (e.g., thickness 78 of FIG. 5) may be between 0.05 and 0.07 microns, between 0.05 and 0.1 microns, less than 0.1 micron, greater than 0.01 microns, or other values.

In still another suitable arrangement, single-layer interference film 76 may, for example, have an atomic percentage of Cr that is between 20-30%, between 23-27%, between 22-29%, between 15-40%, less than 30%, less than 27%, greater than 20%, greater than 23%, or other values, an atomic percentage of Si that is between 50-60%, between 53-59%, between 52-62%, between 45-65%, less than 60%, less than 65%, greater than 50%, greater than 51%, or other values, an atomic percentage of N that is between 10-20%, between 12-16%, between 8-20%, between 11-25%, greater than 10%, greater than 12%, less than 25%, less than 20%, or other values. The remaining balance of atoms in film 76 may be C atoms. In this example, single-layer interference film 76 may configure coating 68 to exhibit an L* value between 30-40, between 35-40, between 37-38, greater than 35, less than 40, or other values, may configure coating 68 to exhibit an a* value between 0 and 5, between 0 and 3, between 2 and 3, less than 3, less than 5, greater than 0, greater than 2, or other values, and may configure coating 68 to exhibit a b* value between −5 and −10, between −6 and −7, between −6 and −11, less than −6, less than −5, greater than −10, greater than −7, or other values (e.g., coating 68 in this example may exhibit a purple color). In this example, the thickness of neutral-color base layer 74 (e.g., thickness 80 of FIG. 5) may be between 0.6 and 1.0 microns, between 0.5 and 1.1 microns, less than 1.0 microns, greater than 0.5 microns, or other values, and the thickness of single-layer interference film 76 (e.g., thickness 78 of FIG. 5) may be between 0.02 and 0.04 microns, between 0.01 and 0.5 microns, less than 0.1 micron, greater than 0.01 microns, or other values. In this example, neutral-color base layer 74 may have an atomic percentage of Cr that is between 30-40%, between 30-35%, greater than 30%, less than 40%, or other values, an atomic percentage of Si that is between 50-60%, between 50-55%, greater than 50%, less than 65%, or other values, and an atomic percentage of N that is between 10-20%, between 11-15%, between 10-16%, less than 15%, greater than 10%, or other values. The remaining balance of atoms in layer 74 may be C atoms.

In another suitable arrangement, single-layer interference film 76 may, for example, have an atomic percentage of Cr that is between 30-40%, between 34-38%, between 33-39%, between 25-40%, less than 40%, less than 45%, greater than 30%, greater than 33%, or other values, an atomic percentage of Si that is between 20-30%, between 21-25%, between 19-26%, between 15-35%, less than 30%, less than 25%, greater than 20%, greater than 21%, or other values, an atomic percentage of N that is between 30-45%, between 35-41%, between 33-43%, between 25-45%, greater than 35%, greater than 30%, less than 45%, less than 42%, or other values. The remaining balance of atoms in film 76 may be C atoms. In this example, single-layer interference film 76 may configure coating 68 to exhibit an L* value between 30-40, between 35-40, between 37-38, greater than 35, less than 40, or other values, may configure coating 68 to exhibit an a* value between 0 and 5, between 0 and 3, between 2 and 3, less than 3, less than 5, greater than 0, greater than 2, or other values, and may configure coating 68 to exhibit a b* value between −5 and −10, between −7 and −8, between −6 and −11, less than −7, less than −5, greater than −10, greater than −8, or other values (e.g., coating 68 in this example may exhibit a purple color). In this example, the thickness of neutral-color base layer 74 (e.g., thickness 80 of FIG. 5) may be between 0.5 and 0.7 microns, between 0.4 and 0.8 microns, less than 0.8 microns, greater than 0.5 microns, or other values, and the thickness of single-layer interference film 76 (e.g., thickness 78 of FIG. 5) may be between 0.02 and 0.04 microns, between 0.01 and 0.5 microns, less than 0.1 micron, greater than 0.01 microns, or other values. In this example, neutral-color base layer 74 may have an atomic percentage of Cr that is between 30-40%, between 35-40%, greater than 30%, less than 40%, or other values, an atomic percentage of Si that is between 10-25%, between 17-21%, greater than 15%, less than 25%, or other values, and an atomic percentage of N that is between 30-50%, between 38-46%, between 35-48%, less than 50%, greater than 30%, or other values. The remaining balance of atoms in layer 74 may be C atoms. These examples are merely illustrative and, in general, film 76 and layer 74 may each include any desired percentage of Cr atoms, Si atoms, N atoms, and C atoms, may have any desired thicknesses, and may exhibit any desired color profile.

Figure 8:
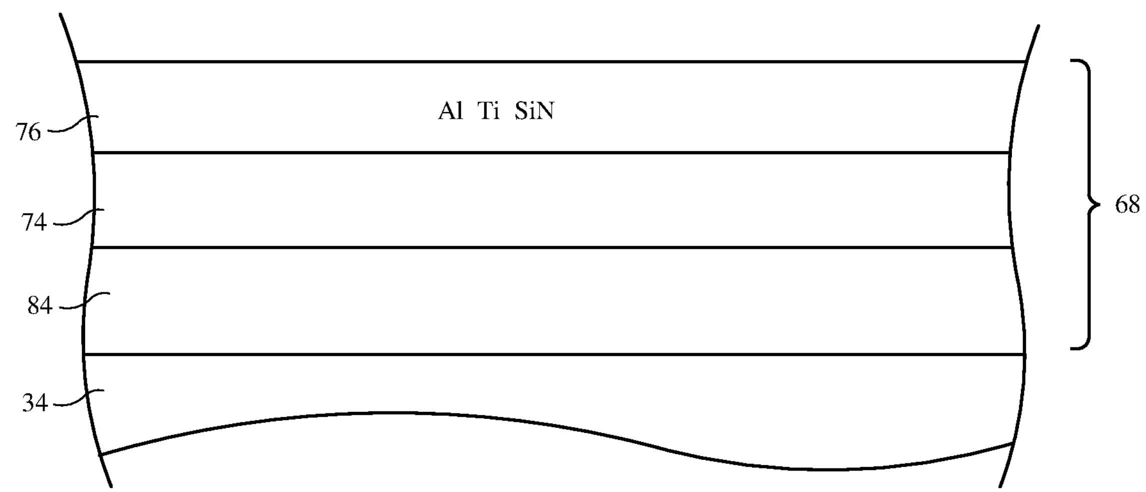
FIG. 8 is a cross-sectional side view of an illustrative coating of the type shown in FIG. 5, having a single-layer interference film formed from aluminum titanium silicon nitride in accordance with some embodiments.

In another suitable example, single-layer interference film 76 may include aluminum titanium silicon nitride (AlTiSiN), as shown in the cross-sectional side view of FIG. 8. As shown in FIG. 8, single-layer interference film 76 may be an AlTiSiN layer. Neutral-color base layer 74 may be formed using any suitable materials (e.g., CrSiCN). Single-layer interference film 76 may include any desired percentage of Al atoms, Ti atoms, Si atoms, and N atoms. In yet another suitable example, single-layer interference film 76 may include titanium silicon nitride (TiSiN). TiSiN may, for example, exhibit more stable characteristics than AlTiSiN.

When arranged in this way, coating 68 may otherwise exhibit a relatively neutral color due to the presence of neutral-color base layer 74. The presence of single-layer interference film 76 may modify the neutral reflective response of neutral-color base layer 74 (e.g., due to destructive interference of reflected light 44' and 44" of FIG. 5) to provide coating 68 and thus substrate 34 with a desired mid-spectrum visible color (e.g., a green color). The composition of neutral-color base layer 74 may be selected to provide coating 68 with the desired neutral base color that is modified by single-layer interference film 76.

Figure 9:
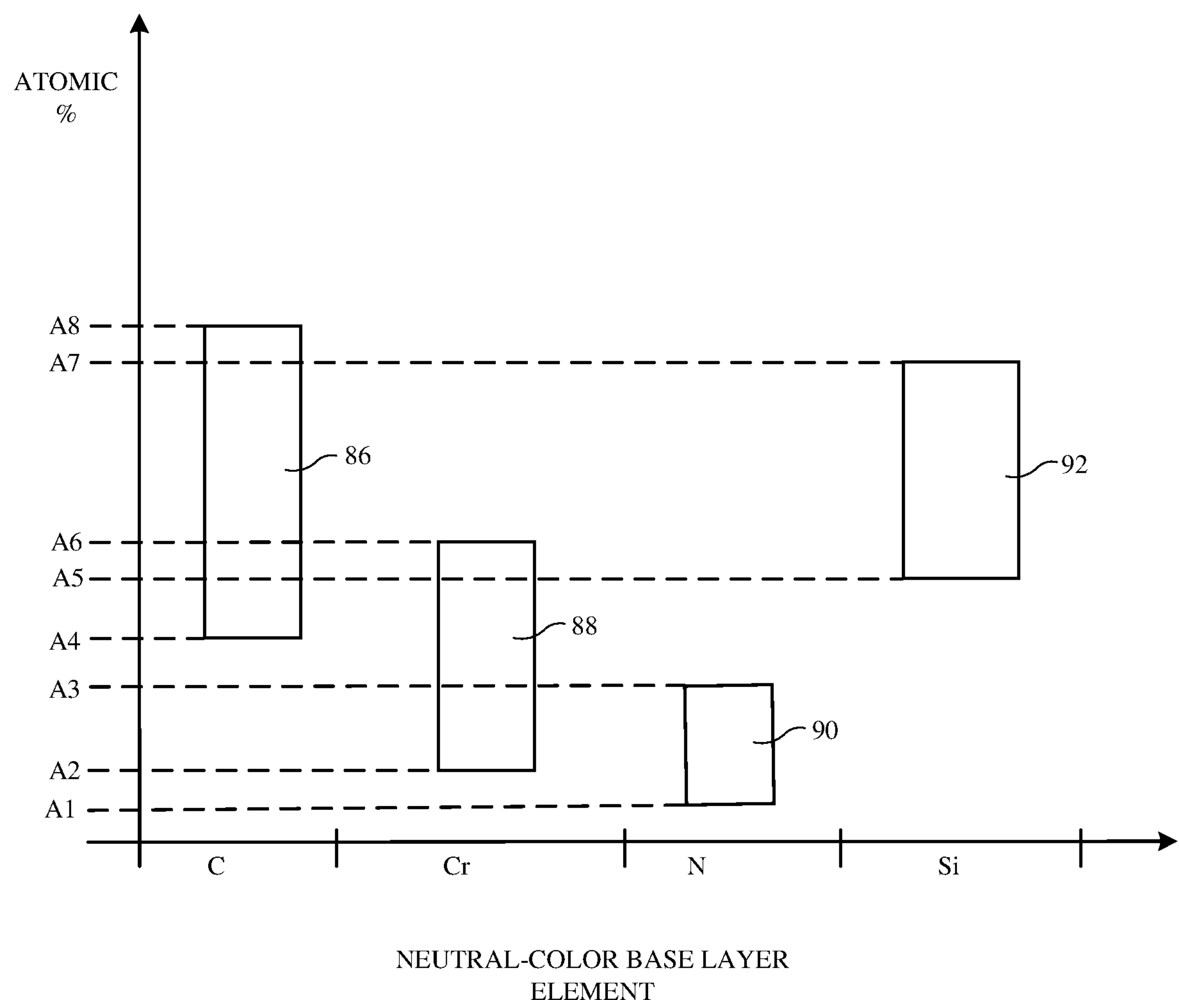
FIG. 9 is a plot of the atomic percentage of different elements in an illustrative color-neutral base layer for a coating of the type shown in FIGS. 5-8 in accordance with some embodiments.

FIG. 9 is a plot of illustrative atomic percentages for the different elements in neutral-color base layer 74 in examples where neutral-color base layer 74 is a CrSiCN layer. As shown in FIG. 9, the composition of neutral-color base layer 74 may be selected such that the atomic percentage of C atoms in neutral-color base layer 74 lies within region 86 (e.g., a region extending between upper limit A8 and lower limit A4), the atomic percentage of Cr atoms in neutral-color base layer 74 lies within region 88 (e.g., a region extending between upper limit A6 and lower limit A2), the atomic percentage of N atoms in neutral-color base layer 74 lies within region 90 (e.g., a region extending between upper limit A3 and lower limit A1), and the atomic percentage of Si atoms in neutral-color base layer 74 lies within region 92 (e.g., a region extending between upper limit A7 and lower limit A5).

In the example of FIG. 9, atomic percentage A8 is greater than atomic percentage A7, which is greater than atomic percentage A6, which is greater than atomic percentage A5, which is greater than atomic percentage A4, which is greater than atomic percentage A3, which is greater than atomic percentage A2, which is greater than atomic percentage A1 (e.g., layer 74 may have more, the same, or fewer C atoms than Si atoms, more, the same, or fewer C atoms than Cr atoms, fewer N atoms than C atoms, fewer N atoms than Si atoms, more, the same, or fewer Cr atoms than Si atoms, and more, the same, or fewer N atoms than Cr atoms. This is merely illustrative and, in general, these percentages may have other relative magnitudes.

As an example, the upper limit A8 of region 86 (e.g., the upper limit on the atomic percentage of C atoms in layer 74) may be between 50% and 60%, between 55% and 60%, between 45% and 65%, greater than 55%, greater than 50%, or other values. The lower limit A4 of region 86 (e.g., the lower limit on the atomic percentage of C atoms in layer 74) may be between 20% and 30%, between 15% and 25%, between 21% and 25%, less than 25%, less than 30%, less than 26%, or other values less than upper limit A8.

The upper limit A6 of region 88 (e.g., the upper limit on the atomic percentage of Cr atoms in layer 74) may be between 20% and 40%, between 25% and 30%, greater than 25%, greater than 20%, greater than 27%, between 20% and 35%, or other values. The lower limit A2 of region 88 (e.g., the lower limit on the atomic percentage of Cr atoms in layer 74) may be between 1% and 10%, between 2% and 5%, between 2% and 3%, less than 10%, less than 5%, less than 3%, or other values less than upper limit A6.

The upper limit A3 of region 90 (e.g., the upper limit on the atomic percentage of N atoms in layer 74) may be between 4% and 9%, between 1% and 10%, between 8% and 15%, greater than 3%, greater than 5%, greater than 7%, or other values. The lower limit A1 of region 90 (e.g., the lower limit on the atomic percentage of N atoms in layer 74) may be between 1% and 5%, between 0.5% and 6%, between 1% and 2%, less than 6%, less than 5%, less than 2%, or other values less than upper limit A3.

The upper limit A7 of region 92 (e.g., the upper limit on the atomic percentage of Si atoms in layer 74) may be between 50% and 60%, between 52% and 57%, greater than 50%, greater than 52%, greater than 45%, or other values. The lower limit A5 of region 92 (e.g., the lower limit on the atomic percentage of Si atoms in layer 74) may be between 30% and 50%, between 30% and 40%, between 25% and 35%, less than 50%, less than 45%, less than 35%, or other values less than upper limit A7. These examples are merely illustrative and, in general, other atomic percentages of these elements may be used (e.g., regions 86, 88, 90, and 92 may have other heights and/or relative positions).

In one suitable arrangement that is sometimes described herein as an example, single-layer interference film 76 may be a CrSiN film (e.g., as shown in FIG. 6) or a CrSiCN film (e.g., as shown in FIG. 7), whereas neutral-color base layer 74 is a CrSiCN film having an atomic percentage of Cr atoms between about 1% and 20% (e.g., between 2% and 12%, between 1% and 14%, between 2.5% and 11%, between 1.5% and 12.5%, etc.), an atomic percentage of Si atoms between about 25% and 50% (e.g., between 33% and 45%, between 34% and 42%, between 35% and 44%, etc.), an atomic percentage of C atoms between about 35% and 65% (e.g., between 41% and 56%, between 40% and 58%, between 38.5% and 61.5%, etc.), and an atomic percentage of N atoms between about 1% and 12% (e.g., between 3% and 9.5%, between 4.5% and 8.5%, between 5% and 9%, etc.).

In another suitable arrangement, single-layer interference film 76 may be a CrSiN film (e.g., as shown in FIG. 6) or a CrSiCN film (e.g., as shown in FIG. 7), whereas neutral-color base layer 74 is a CrSiCN film having an atomic percentage of Cr atoms between about 10% and 35% (e.g., between 17% and 28%, between 20% and 29%, between 15.5% and 31.5%, etc.), an atomic percentage of Si atoms between about 35% and 65% (e.g., between 38% and 58%, between 43% and 55%, between 42% and 56%, etc.), an atomic percentage of C atoms between about 15% and 40% (e.g., between 23% and 34%, between 21% and 37.5%, between 15.5% and 34.5%, etc.), and an atomic percentage of N atoms between about 0.5% and 8% (e.g., between 1% and 5.5%, between 1.5% and 5%, between 1.5% and 4%, etc.). These examples are merely illustrative and, if desired, the CrSiCN film used to form neutral-color base layer 74 and/or single-layer interference film 76 may have other compositions (e.g., compositions of CrSiCN or other materials where the L* value of layer 74 is less than or equal to about 62 and greater than or equal to about 48, the |a*| value of layer 74 is less than about 2, and the |b*| value of layer 74 is less than about 2).

Figure 10:
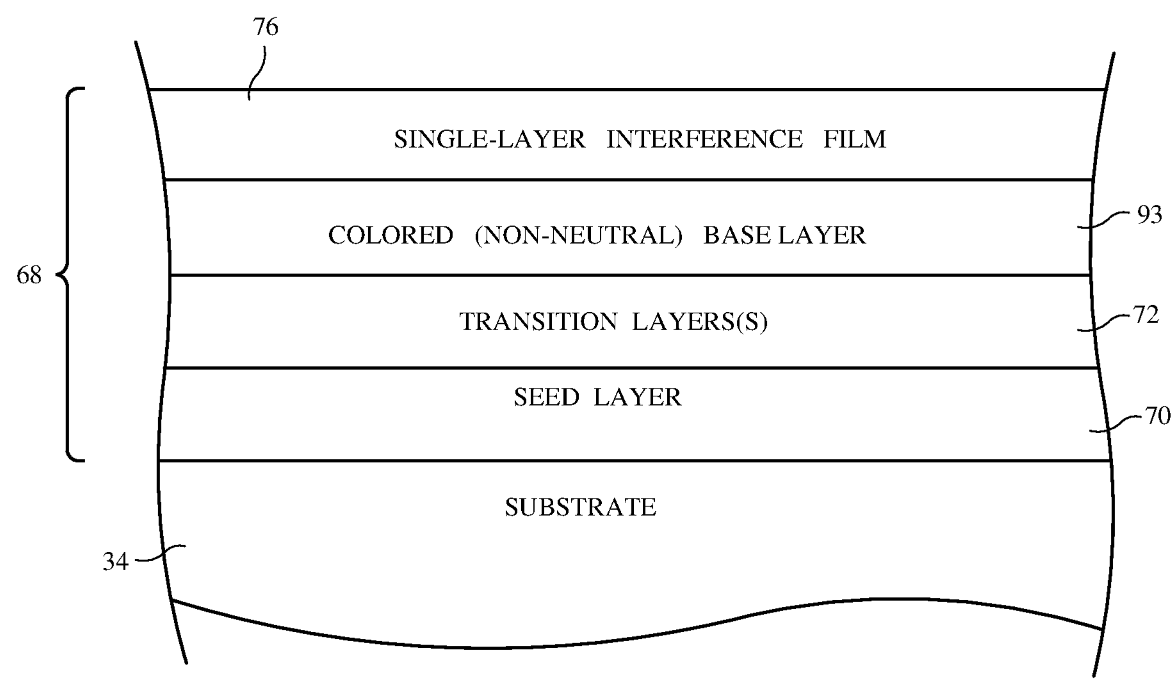
FIG. 10 is a cross-sectional side view of an illustrative coating having a colored base layer and a single-layer interference film in accordance with some embodiments.

If desired, neutral-color base layer 74 may be replaced by a colored (e.g., non-neutrally colored) base layer, as shown in the cross-sectional side view of FIG. 10. As shown in FIG. 10, coating 68 may include a colored base layer such as colored (non-neutral) base layer 93. Colored base layer 93 may, for example, exhibit an L* value that is greater than 62 or less than 48, an |a*| value that is greater than 2, and/or a |b*| value that is greater than 2. Coloring the base layer in this way may contribute to the reflective profile of coating 68 (e.g., to provide coating 68 with other desired colors). Colored base layer 93 may, for example, carry an intrinsic color that is different from the target color for coating 68. In scenarios where colored base layer 93 is used, single-layer interference film 76 may, for example, have a strong wavelength dependence in absorption constant k, so that thickness variations lead to color shifts in both interference and absorption.

The example of FIGS. 5-8 and 10 in which coating 68 includes a single-layer interference film 76 is merely illustrative. In another suitable arrangement, single-layer interference film 76 of FIGS. 5-8 and 10 may be replaced by a multi-layer thin film interference filter (e.g., a filter having multiple stacked films of alternating refractive indices, etc.) that provides coating 68 with a mid-spectrum visible color.

Coating 68 of FIGS. 5-8 and 10 may exhibit minimal variation in reflected color even as the overall thickness H varies (e.g., due manufacturing tolerances associated with the deposition of coating 68 on substrate 34). The use of a single-layer interference film such as single-layer interference film 76 (e.g., the CrSiN film of FIG. 6, the CrSiCN film of FIG. 7, the AlTiSiN film of FIG. 8, etc.) may provide film 76 with a wavelength-dependent absorption coefficient that minimizes a*/b* variations with variations in thickness 78 (FIG. 5). At the same time, single-layer interference film 76 and neutral-color base layer 74 may provide coating 68 with a desired reflection profile and thus with a desired color. In other words, even if the deposition equipment used to deposit coating 68 on substrate 34 exhibits a variation in thickness H of up to 10% across the area of the coating on substrate 34, the color reflected by coating 68 may change by an amount dE that is less than a threshold value over the range of wavelengths that provide the coating with the desired color.

Figure 11:
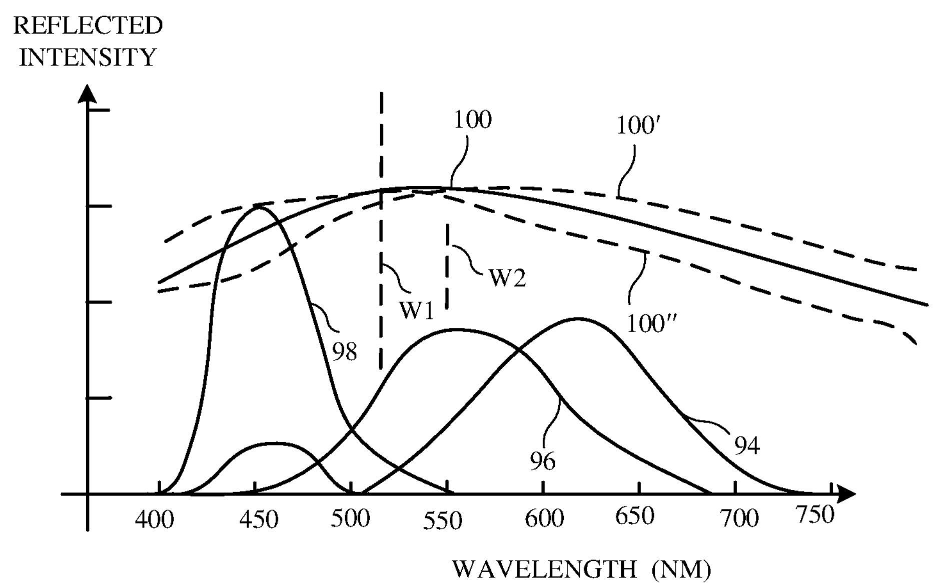
FIG. 11 is a plot of reflected intensity as a function of wavelength for an illustrative coating of the types shown in FIGS. 5-8 and 10 in accordance with some embodiments.

FIG. 11 is a plot of reflected intensity as a function of wavelength for coating 68 of FIGS. 5-8 and 10. As shown in FIG. 11, curves 94, 96, and 98 plot International Commission on Illumination (CIE) XYZ standard observer color matching functions (e.g., weight functions). Curve 94 is used to calculate color coordinate X, which corresponds to a red stimulus (e.g., to approximate the human eye sensitivity to red light). Curve 96 is used to calculate color coordinate Y, which corresponds to a green stimulus (e.g., to approximate the human eye sensitivity to green light). Curve 98 is used to calculate color coordinate Z, which corresponds to a blue stimulus (e.g., to approximate the human eye sensitivity to blue light). Color coordinates X, Y, and Z can then be used to calculate L*, a*, and b* values in a CIE L*a*b* color space.

Curve 100 plots the reflective color response of coating 68 when provided with thickness H (FIG. 5). Curve 100' plots the reflective color response of coating 68 when coating 68 has a thickness less than thickness H (e.g., 6% less than thickness H or some other value). Curve 100" plots the reflective color response of coating 68 when coating 68 has a thickness greater than thickness H (e.g., 6% greater than thickness H or some other value).

In general, the perceived color of coating 68 is very unstable to variations in thickness if both X and Z color coordinates change while Y remains mostly unchanged or changes in the opposite direction. On the other hand, the perceived color of coating 68 is more stable if at least one of the pairs of X/Y color coordinates or X/Z color coordinates change in the same direction. As shown by curves 100, coating 68 exhibits a peak reflected intensity at wavelength W1, which is offset from the peak of curve 96 (associated with color coordinate Y). As shown by curves 100' and 100", variations in the thickness of coating 68 shift the peak reflected intensity to different wavelengths that are still offset from the peak of curve 96. This means that thickness variations in coating 68 lead to changes of the Y coordinate and the Z coordinate in the same direction. Translated to the a*−b* color space, where a*=f(X)−f(Y) and b*=f(Y)−f(Z), a* will show less variation than when curves 100, 100', and 100" peak at the peak of curve 96.

In other words, by configuring coating 68 using the arrangement of FIGS. 5-8 and 10, coating 68 may be configured such that the reflected intensity of the coating exhibits a peak that does not overlap with the peak of curve 96, even under variations in thickness, which allows the coating to exhibit a relatively stable mid-visible-spectrum color response (e.g., a green color response) even as the thickness of the coating varies (e.g., due to an underlying three-dimensional substrate, manufacturing variations, etc.). In other scenarios (e.g., where coating 36 of FIG. 3 is used), the reflected intensity curve of the coating is closer to the maximum sensitivity for the green color coordinate Y (e.g., with wavelength W2 at the peak of curve 96). Thickness variations in the coating in this scenario will lead to low change in color coordinate Y but significant change in color coordinates X and Z. Translated to a*−b* color space, both a* and b* will show a large variation in this scenario. Unlike coating 36 of FIG. 3, by providing coating 68 with the arrangement of FIGS. 5-8 and 10, coating 68 may exhibit a sufficiently stable color response at these mid-spectrum wavelengths.

In this way, even if coating 68 has different thicknesses across substrate 34 (e.g., in scenarios where substrate 34 is a three-dimensional substrate and/or where the deposition equipment used to deposit the coating is incapable of providing the coating with a precise thickness), coating 68 may still provide substrate 34 with a uniform mid-spectrum visible color across the entire area of the substrate. This may allow substrate 34 to exhibit an attractive uniform color that maximizes the aesthetic appearance of substrate 34. The example of FIG. 11 is merely illustrative. In general, curves 94, 96, 98, 100, 100', and 100" may have other shapes (e.g., shapes that peak at any desired wavelengths between 380 nm and 780 nm).

The foregoing is merely illustrative and various modifications can be made to the described embodiments. The foregoing embodiments may be implemented individually or in any combination.

What is claimed is:

1. An electronic device, comprising:
a conductive structure; and
a visible-light-reflecting coating on the conductive structure, the visible-light-reflecting coating comprising:
adhesion and transition layers on the conductive structure,
a neutral-color base layer on the adhesion and transition layers, and
a single-layer interference film on the neutral-color base layer, the single-layer interference film comprising silicon.

2. The electronic device defined in claim 1, wherein the single-layer interference film comprises CrSiN.

3. The electronic device defined in claim 2, wherein the neutral-color base layer comprises CrSiCN.

4. The electronic device defined in claim 1, wherein the single-layer interference film comprises CrSiCN.

5. The electronic device defined in claim 4, wherein the neutral-color base layer comprises CrSiCN and wherein the single-layer interference film forms an upper-most layer of the visible-light-reflecting coating.

6. The electronic device defined in claim 5, wherein an atomic percentage of Si atoms in the neutral-color base layer is between 30% and 60%, wherein an atomic percentage of Cr atoms in the neutral-color base layer is between 1% and 40%, wherein an atomic percentage of C atoms in the neutral-color base layer is between 15% and 65%, and wherein an atomic percentage of N atoms in the neutral-color base layer is between 0.5% and 15%.

7. The electronic device defined in claim 1, wherein the single-layer interference film comprises a material selected from the group consisting of: AlTiSiN and TiSiN.

8. The electronic device defined in claim 1, wherein the neutral-color base layer is opaque, has an L* value between 48 and 62, an |a*| value less than 2, and a |b*| value less than 2.

9. The electronic device defined in claim 1, wherein the single-layer interference film has a thickness between 50 nm and 150 nm.

10. The electronic device defined in claim 9, wherein the visible-light-reflecting coating has a thickness between 1.2 microns and 1.8 microns, the single-layer-interference film has a first index of refraction, the neutral-color base layer has a second index of refraction that is greater than the first index of refraction, and the single-layer-interference film has an absorption coefficient that is greater than 0 and less than 1.

11. The electronic device defined in claim 1, wherein the adhesion and transition layers comprise a seed layer on the conductive structure and a transition layer on the seed layer, wherein the seed layer comprises a material selected from the group consisting of: Cr, CrSi, and Ti, and wherein the transition layer comprises a material selected from the group consisting of: CrSiN, CrSiCN, CrN, and CrCN.

12. The electronic device defined in claim 1, wherein the conductive structure has a three-dimensional surface and wherein the visible-light-reflecting coating is deposited on the three-dimensional surface.

13. Apparatus comprising:

a conductive substrate; and a coating on the conductive substrate that configures the conductive substrate to exhibit a color, the coating comprising:

adhesion and transition layers on the conductive substrate, an CrSiCN layer on the adhesion and transition layers, the CrSiCN layer being opaque to light of the color, and an uppermost layer on the CrSiCN layer, the uppermost layer comprising CrSiN.

14. The apparatus defined in claim 13, wherein the uppermost layer forms an interference film and the color comprises a wavelength between 500 nm and 600 nm.

15. The apparatus defined in claim 14, wherein an atomic percentage of Cr atoms in the uppermost layer is less than 10% and wherein an atomic percentage of Si atoms in the uppermost layer is between 5% and 20%.

16. The apparatus defined in claim 14, wherein an atomic percentage of Si atoms in the CrSiCN layer is between 30% and 60%, wherein an atomic percentage of Cr atoms in the CrSiCN layer is between 1% and 40%, wherein an atomic percentage of C atoms in the CrSiCN layer is between 15% and 65%, and wherein an atomic percentage of N atoms in the CrSiCN layer is between 0.5% and 15%.

17. The apparatus defined in claim 14, wherein the adhesion and transition layers comprise a seed layer on the conductive substrate and a transition layer on the seed layer, wherein the seed layer comprises a material selected from the group consisting of: Cr, CrSi, and Ti, and wherein the transition layer comprises a material selected from the group consisting of: CrSiN, CrSiCN, CrN, and CrCN.

18. An electronic device comprising:

a conductive housing wall; and a coating on the conductive housing wall, the coating comprising:

adhesion and transition layers on the conductive housing wall, an CrSiCN layer on the adhesion and transition layers, the CrSiCN layer being opaque to visible light, and an uppermost layer that forms an interference film for the visible light and that comprises CrSiCN.

19. The electronic device defined in claim 18, wherein an atomic percentage of Cr atoms in the uppermost layer is less than 10%, wherein an atomic percentage of Si atoms in the uppermost layer is between 5% and 20%, and wherein an atomic percentage of N atoms in the uppermost layer is between 10% and 15%.

20. The electronic device defined in claim 18, wherein the CrSiCN layer has an L* value between 48 and 62, an |a*| value less than 2, and a |b*| value less than 2.

21. The electronic device defined in claim 18, wherein an atomic percentage of Cr atoms in the uppermost layer is between 20-30%, wherein an atomic percentage of Si atoms in the uppermost layer is between 50% and 60%, wherein an atomic percentage of N atoms in the uppermost layer is between 10% and 20%, wherein an atomic percentage of Cr atoms in the CrSiCN layer is between 30% and 40%, wherein an atomic percentage of Si atoms in the CrSiCN layer is between 50% and 60%, and wherein an atomic percentage of N atoms in the CrSiCN layer is between 10% and 20%.

22. The electronic device defined in claim 21, wherein the uppermost layer has a thickness between 0.01 and 0.05 microns and wherein the coating has an L* value between 30 and 40, an a* value between 0 and 5, and a b* value between −10 and 0.

23. The electronic device defined in claim 18, wherein an atomic percentage of Cr atoms in the uppermost layer is between 30-40%, wherein an atomic percentage of Si atoms in the uppermost layer is between 20% and 30%, and wherein an atomic percentage of N atoms in the uppermost layer is between 30% and 40%.

24. The electronic device defined in claim 23, wherein the uppermost layer has a thickness between 0.05 and 0.07 microns and wherein the coating has an L* value between 40 and 50, an a* value between −5 and 0, and a b* value between −5 and −15.

* * * * *